United States Patent [19]

Tsuno

[11] 4,450,357

[45] May 22, 1984

[54] ELECTRON LENS EQUIPPED WITH THREE MAGNETIC POLE PIECES

[75] Inventor: Katsushige Tsuno, Tokyo, Japan

[73] Assignee: Jeol Ltd., Tokyo, Japan

[21] Appl. No.: 310,735

[22] Filed: Oct. 13, 1981

[51] Int. Cl.³ .............................................. H01J 29/64
[52] U.S. Cl. ............................................ 250/356 ML
[58] Field of Search ................... 250/396 ML, 396 R; 328/228

[56] References Cited

U.S. PATENT DOCUMENTS 2,323,328  7/1943  Hillier ........................ 250/396 ML

FOREIGN PATENT DOCUMENTS 2080610  2/1982  United Kingdom ........ 250/396 ML

Primary Examiner—Bruce C. Anderson
Attorney, Agent, or Firm—Webb, Burden, Robinson & Webb

[57] ABSTRACT

An electron lens equipped with three magnetic pole pieces defining two gaps forming two magnetic fields of opposite polarities. The magnetomotive force of the magnetic field in the upper gap is fixed at a value close to the magnetomotive force providing a minimum focal length under the condition that the magnetomotive forces in both gaps are equal to each other, and a magnetomotive force of the magnetic field in the lower gap is larger than that of the magnetic field in the upper gap, so that not only radial and spiral distortions are eliminated but also the focal length is shortened.

6 Claims, 4 Drawing Figures

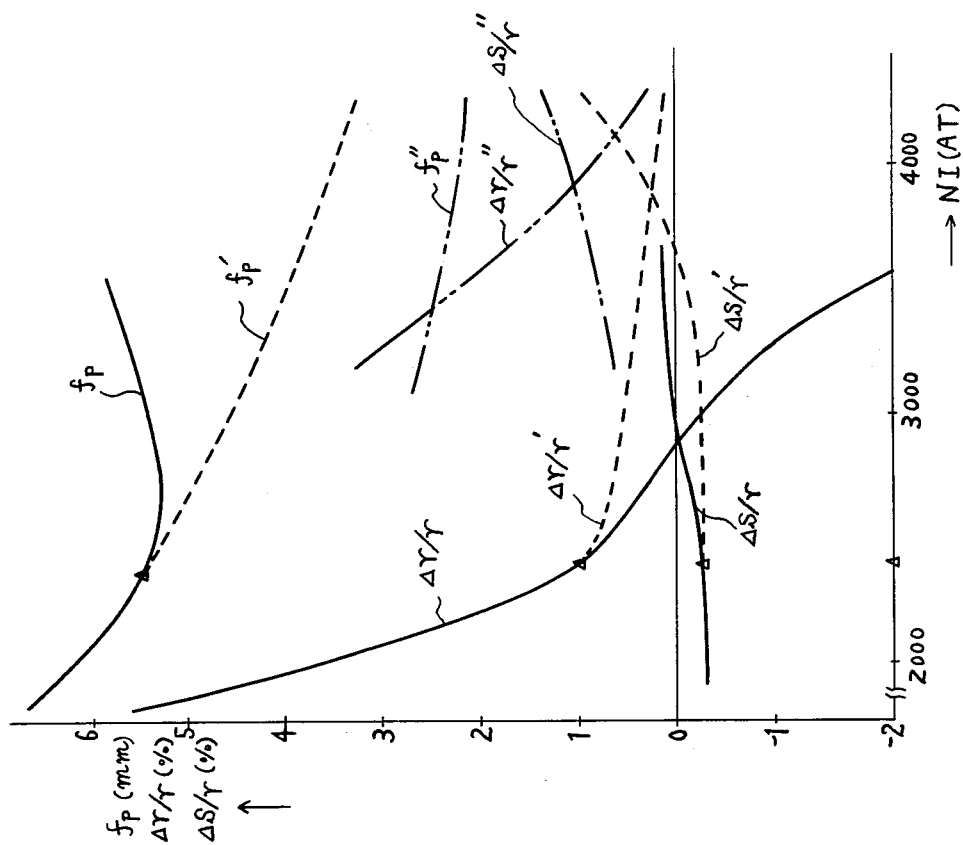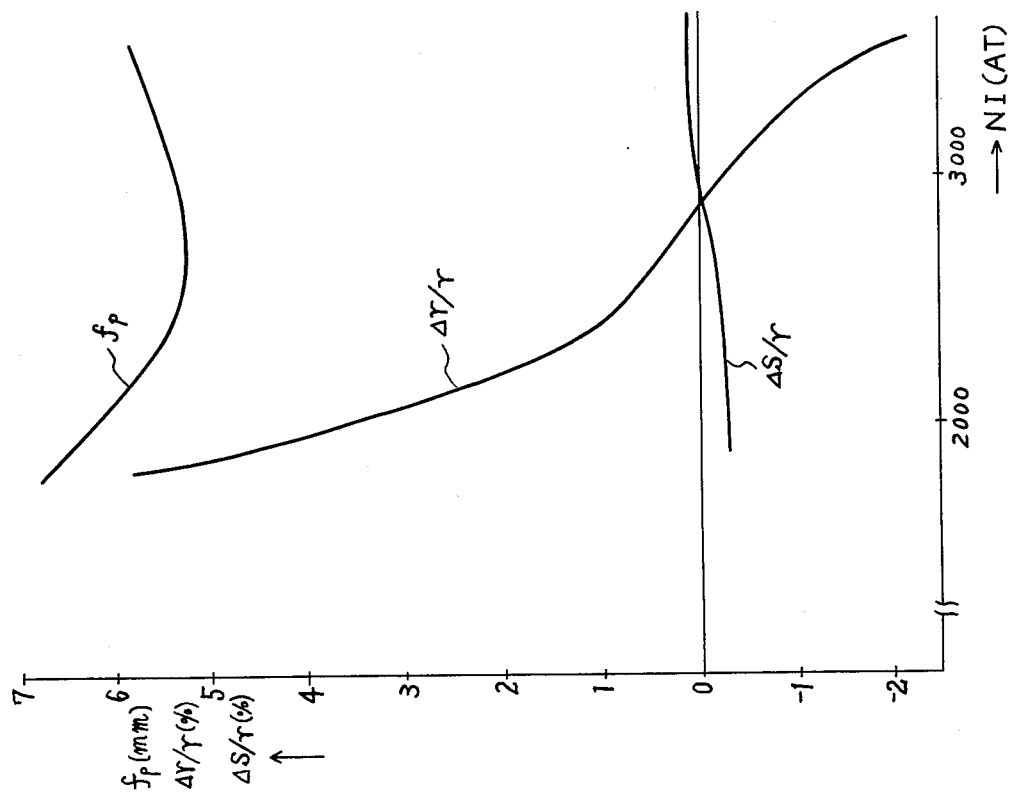

ELECTRON LENS EQUIPPED WITH THREE MAGNETIC POLE PIECES

BACKGROUND

This invention relates to an electron lens, equipped with three magnetic pole pieces, capable of eliminating radial and spiral distortions and capable of shortening the focal length thereof.

It has recently been proposed to use as a projector lens a lens equipped with three magnetic pole pieces defining two gaps of opposite excitation. This lens has been found capable of eliminating not only a radial distortion but also a spiral distortion under a certain exciting condition if the magnetic pole pieces are shaped asymmetrical to render an axial magnetic field in the upper gap less intensive than that in the lower gap.

FIG. 1 is a view showing schematically the prior electron lens thus designed. In the figure, two excitation coils 1 and 2, which are connected in series and supplied with the current (I) from a lens power supply 3, are enveloped by a ferromagnetic yoke 4 and non-ferromagnetic spacers 5 and 6. Inside the yoke, the upper pole piece 7, middle pole piece 8 and lower pole piece 9 and their non-ferromagnetic spacers 10 and 11 are installed. The shape of the lens is nearly symmetrical to the center of the middle pole piece. The upper and middle magnetic pole pieces 7 and 8 define an upper gap S1 therebetween, and the middle and lower magnetic pole pieces 8 and 9 define a lower gap S2 therebetween. The length of both gaps S1 and S2 are equal. The bore diameters d2 and d3 of the middle and lower magnetic pole pieces are substantially equal. On the other hand, the diameter d1 of the upper pole piece is 1.5 to 5 times larger than those of the middle and lower pole pieces so that the axial magnetic field in the upper gap is less intensive than that in the lower gap. The turn number (N) of each coil, 1 and 2, is the same and the winding direction of each coil is determined so that polarity of the magnetic field appearing in the upper and lower gaps is opposite to each other and the magnetic field appearing in the upper and lower gaps is generated by the same excitation intensity.

FIG. 2 shows the focal length $f_p$ (mm), radial distortion $\Delta r/r$ (%) and spiral distortion $\Delta S/r$ (%) of the lens shown in FIG. 1 in relation to the excitation (magnetomotive force) NI (ampere turns). The graph shown is obtained under the condition in which accelerating voltage of the electron beam equals 100 KV. In the event that accelerating voltage does not equal 100 KV, the following conversion equation is established:

$$\frac{(NI)_{100KV}}{\sqrt{109785}} = \frac{NI}{\sqrt{V^*}}$$

where:
V*: accelerating voltage (V) of the electron beam corrected "principle of relativity".
NI: value of NI (ampere turns) in the case that accelerating voltage of the electron beam equals V*.
$(NI)_{100\,KV}$: Value of NI (ampere turns) in FIG. 2.

As is noted from FIG. 2, the focal length $f_p$ shows a minimum value (about 5.3 mm) at an excitation value in the vicinity of 2700 AT, and the radial distortion $\Delta r/r$ and spiral distortion $\Delta S/r$ are eliminated at an excitation NI in the range of 2800 to 2900 AT.

With such a lens, however, since the minimum focal length is 5.3 mm, the magnification Mp of a projector lens is about 72 times for an electron microscope in which the projector lens is spaced from film by a distance L=380 mm. Therefore, high-magnification observation such as 500,000 or 1,000,000 times cannot be made with such a unit, and the projector lens needs to be changed between high and low magnification observations.

Now, it should be considered first why the focal length of a triple-pole piece lens is longer than that of a bi-pole piece lens. The focal length of an ordinary bi-pole piece lens can be expressed by a Liebmann curve. On the other hand, with a triple-pole piece lens, the focal length is minimum under a certain magnetomotive force, and it increases with an increase in the excitation. This phenomenon arises out of the fact that the magnetic field generated in the upper gap S1 serves as a reduction lens.

SUMMARY OF THE INVENTION

Briefly, according to this invention, an electron lens is equipped with three magnetic pole pieces defining two gaps to form two magnetic fields of opposing polarities. The magnetomotive force of the magnetic field in the upper gap is fixed at a value close to the magnetomotive force providing a minimum focal length under the condition that the magnetomotive forces in both gaps are equal to each other, and a magnetomotive force of the magnetic field in the lower gap is larger than that of the magnetic field in the upper gap, so that not only radial and spiral distortions are eliminated but also the focal length is shortened.

It is an object of the present invention to provide an electron lens which can not only eliminate or minimize radial and spiral distortion but also shorten the focal length. The present invention resides in that reduction by the field appearing in the upper gap is kept as low as possible, and a magnetomotive force of the magnetic field in the upper gap is fixed at a certain value irrespective of an increase of magnetomotive force in the lower gap.

THE DRAWINGS

The invention will now be described in further detail with the accompanying drawings.

FIG. 1 is a schematic drawing showing a prior lens equipped with three magnetic pole pieces, FIG. 2 is a graph for explaining the lens shown in FIG. 1, FIG. 3 is an essential part of one embodiment according to the invention, and FIG. 4 is a graph showing measurement of properties in the embodiment according to this invention.

DESCRIPTION OF THE PREFERRED EMBODIMENT

Figures 1, 3:
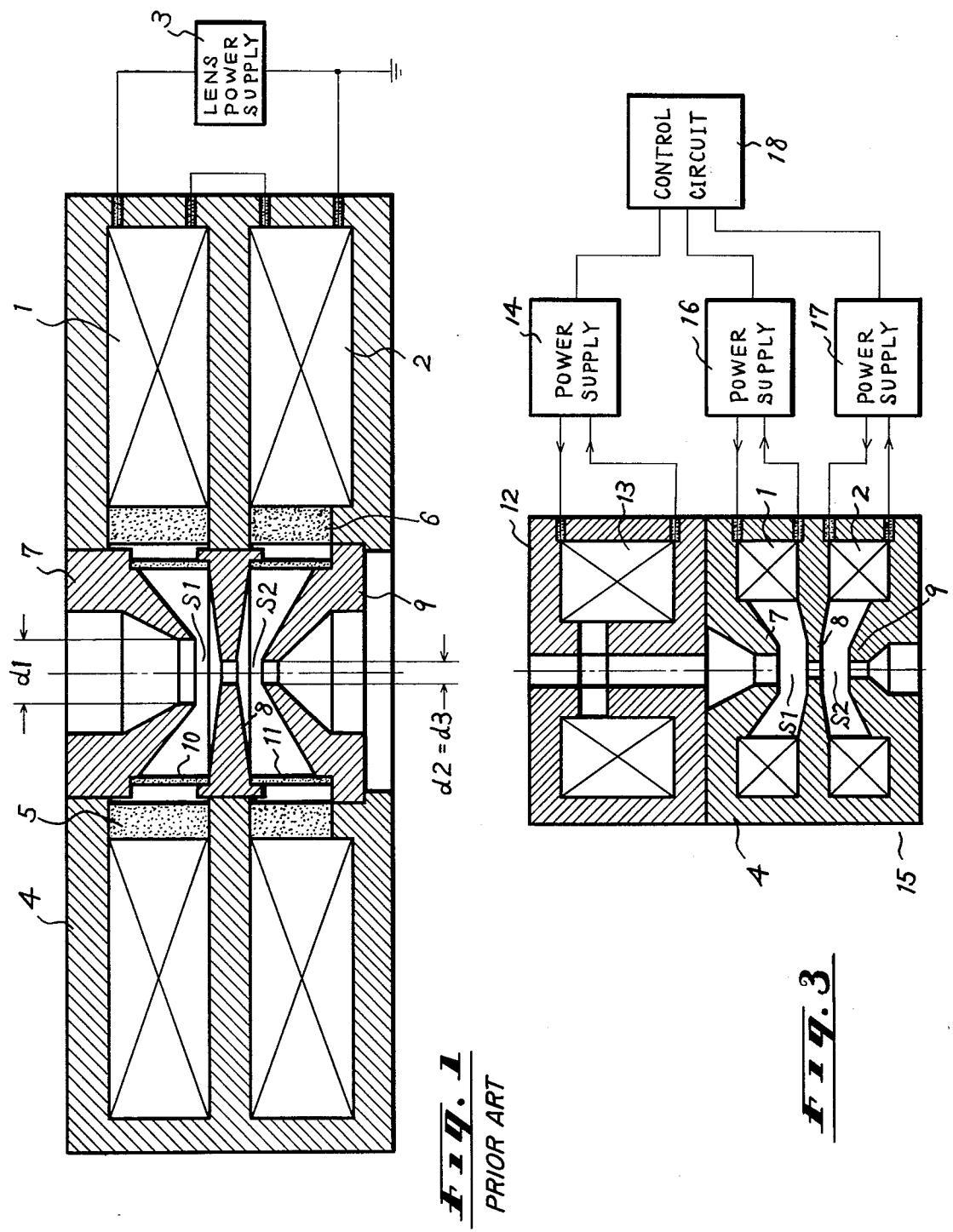

FIG. 3 shows the essential part of one embodiment according to the invention. In this figure the constituent parts having index numbers corresponding to those in FIG. 1 are identical. An intermediate lens 12 has an excitation coil 13 connected to a power supply 14. A projector lens 15 has three magnetic pole pieces 7, 8, 9 and includes excitation coils 1, 2 connected, respectively, to power supplies 16, 17 for generating a magnetic field in the upper gap S1 and a magnetic field in the lower gap S2, respectively. The power supplies 14, 16, 17 are controlled by a magnification control circuit 18 to supply electric current to the coils according to the desired magnifications.

For relatively low magnifications such as several thousand to several tens of thousand times, the coils 1, 2 in the projector lens 15 are supplied with an electric current which generates magnetic fields in the gaps S1, S2, which are of the same magnetomotive force and have opposite polarities, substantially eliminating radial and spiral distortions. For relatively high magnifications of several tens of thousand to several hundreds of thousand times, the coil 1 is supplied with an electric current having a value which minimized the focal length $f_p$ under the condition that the magnetomotive forces in both gaps are equal to each other, and the coil 2 is supplied with a larger electric current, thus shortening the focal length.

FIG. 4 is a graph illustrative of characteristics according to the present invention. The focal length, radial distortion and spiral distortion are indicated respectively by broken line curves $f_p'$, $\Delta r/r'$, $\Delta S/r'$ which are obtained when the magnetomotive force NI1 in the upper gap is fixed at a value of about 2400 AT (marked with "Δ" on the "X-axis"), and the magnetomotive force NI2 in the lower gap is increased. Under such conditions, the focal length $f_p'$ and the radial distortions $\Delta r/r'$ are reduced as the magnetomotive force NI2 is increased. As an example, $f_p'=3.6$ mm, $\Delta r/r'=0.3\%$ and $\Delta S/r'=0.15\%$ when NI1=2400 AT and NI2=3800 AT, a result which is advantageous. With such reduced radial distortion and spiral distortion, a straight line on a fluorescent screen can be seen almost without any distortion. Under the foregoing condition, the magnification of the projector lens with L=380 mm is about 106 times, which is about the bi-pole piece projector lens. The fixed value for the magnetomotive force NI1 of the magnetic field in the upper gap is selected at a point where the focal length $f_p$ (indicated by the solid line curve) is minimum. Stated otherwise, the magnetomotive force NI1 is fixed approximately at a value for providing a minimum focal length under the condition that the magnetomotive forces in both gaps are equal to each other. An experiment indicated that the fixed magnetomotive force NI1 of a value slightly smaller than the value for which the focal length $f_p$ is of a minimum gives the best results. If the magnetomotive force NI1 is fixed at a value for which the focal length $f_p$ is large, the curve $f_p'$ is shifted upwardly and the focal length cannot be reduced greatly.

As is clear from the description above, where the present invention is applied to an electron microscope, the magnetomotive forces of the magnetic fields in the upper and lower gaps should be about 2900 AT for magnifications of several thousand to several tens of thousand times, and the magnetomotive forces in the upper and lower gaps should be about 2400 AT and 3800 AT for relatively high magnifications of several tens of thousand to several hundreds of thousand times, thereby producing distortionless images irrespective of varying magnifications.

For higher magnifications more than several hundred of thousand times, no current is supplied to the coil 1, thereby making the focal length much shorter. Characteristic curves as shown by the two-dot-and dash lines plotted in FIG. 4. While radial distortion $\Delta r/r''$ and spiral distortion $\Delta S/r''$ are slightly larger than the foregoing, the focal length $f_p''$ is much shorter. With the magnetomotive force at about 4000 AT, both distortions are about 1% and the focal length is 2.1 mm. The magnification in this case is approximately 180 times. Such values are larger than these of an ordinary bi-pole piece lens, and enable microscopic observation in the range of high magnifications (higher than 1,000,000 times) in which no spiral distortion causes problems.

According to the embodiment of this invention as hereinabove described in detail, it is possible to obtain an electron lens which can not only eliminate or minimize radial and spiral distortion but also shorten the focal length. In other words, it is possible to obtain an electron lens which can be used in a wide range of low to high magnification observation without substantial radial and spiral distortions.

In the embodiment described, bore diameter d1 is 1.5 to 5 times larger than d2 to render an axial magnetic field in the upper gap less intensive than an axial magnetic field in the lower gap. However, this invention can be applied similarly to such lens that s1/s2 ratio is in the range of 2.7 to 3.8 and d1, d2, d3 are equal, in which S1 and S2 represent the length of the upper gap and lower gap respectively, since in such lens an axial magnetic field in the upper gap is less intensive than that in the lower gap so that radial and spiral distortion can be eliminated.

Further, in the aforementioned embodiment, for magnifications higher than several hundreds of thousand times, either one of the two coils can be used, with the unused coil not being supplied with current.

Having thus described the invention with the detail and particularity required by the Patent Laws, which is desired protected by Letters Patent is set forth in the following claims.

I claim:

1. An electron lens in which three adjacent magnetic pole pieces define two gaps therebetween for generating two magnetic fields of opposite polarities therein at high magnification above about several tens of thousands times, characterized in that the magnetomotive forces of the magnetic fields in the two gaps are selected to be different, said magnetomotive force of the magnetic field in the upper gap being set at a value close to the magnetomotive force providing a minimum focal length under the condition that the magnetomotive forces in both gaps are equal to each other, and said magnetomotive force of the magnetic field in the lower gap being set larger than that of the magnetic field in the upper gap whereby radial and spiral distortions are minimized and the focal length is shortened.

2. An electron lens in which three adjacent magnetic pole pieces define two gaps therebetween for generating two magnetic fields of opposite polarities therein, the magnetic fields being excitable independently of each other, characterized in that for a low magnification below about several tens of thousands, magnetomotive forces of the magnetic fields in the two gaps are set about equal to each other, and for a high magnification above about several tens of thousands times, the magnetomotive forces of the magnetic fields in the two gaps are selected to be different, said magnetomotive force of the magnetic field in the upper gap being set at a value close to the magnetomotive force providing a minimum focal length under the condition that the magnetomotive forces in both gaps are equal to each other, and said magnetomotive force of the magnetic field in the lower gap being set larger than that of the magnetic field in the upper gap whereby radial and spiral distortions are minimized and the focal length is shortened.

3. An electron lens in which three adjacent magnetic pole pieces define two gaps therebetween for generating two magnetic fields of opposite polarities therein, the magnetic fields being excitable independently of each other, characterized in that for a low magnification, magnetomotive forces of the magnetic fields in the two gaps are set about equal to each other, for a high magnification, the magnetomotive forces of the magnetic fields in the two gaps are selected to be different, said magnetomotive force of the magnetic field in the upper gap being set at a value close to magnetomotive force providing a minimum focal length under the condition that the magnetomotive forces in both gaps are equal to each other, and said magnetomotive force of the magnetic field in the lower gap being set larger than that of the magnetic field in the upper gap, and for a higher magnification, one of the gaps has an intensive magnetic field whereby radial and spiral distortions are minimized and the focal length is shortened.

4. A new method of using an electron lens in which three adjacent magnetic pole pieces define two gaps therebetween for generating two magnetic fields of opposite polarities therein at high magnification above about several tens of thousands times, comprising the steps for fixing the magnetomotive force of the magnetic field in the upper gap at a value close to the magnetomotive force providing a minimum focal length under the condition that the magnetomotive forces in both gaps are equal to each other, and fixing the magnetomotive force of the magnetic field in the lower gap to be larger than that of the magnetic field in the upper gap whereby radial and spiral distortions are minimized and the focal length is shortened.

5. A new method of using an electron lens in which three adjacent magnetic pole pieces define two gaps therebetween for generating two magnetic fields of opposite polarities therein, the magnetic fields being excitable independently of each other, comprising the steps for at low magnification below about several tens of thousands, fixing the magnetomotive forces of the magnetic fields in the two gaps to be equal to each other, and at high magnification above about several tens of thousand times, fixing the magnetomotive forces of the magnetic fields in the two gaps to be different, fixing said magnetomotive force of the magnetic field in the upper gap at a value close to the magnetomotive force providing a minimum focal length under the condition that the magnetomotive forces in both gaps are equal to each other, and fixing said magnetomotive force of the magnetic field in the lower gap larger than that of the magnetic field in the upper gap whereby radial and spiral distortions are minimized and the focal length is shortened.

6. A new method of using an electron lens in which three adjacent magnetic pole pieces define two gaps therebetween for generating two magnetic fields of opposite polarities therein, the magnetic fields being excitable independently of each other, comprising the steps for at low magnification, fixing the magnetomotive forces of the magnetic fields in the two gaps to be equal to each other, at high magnification, fixing the magnetomotive forces of the magnetic fields in the two gaps to be different, fixing said magnetomotive force of the magnetic field in the upper gap at a value close to the magnetomotive force providing a minimum focal length under the condition that the magnetomotive forces in both gaps are equal to each other, and fixing said magnetomotive force of the magnetic field in the lower gap to be larger than that of the magnetic field in the upper gap, and for a higher magnification, fixing one of the gaps to have an intensive magnetic field whereby radial and spiral distortions are minimized and the focal length is shortened.

* * * * *